United States Patent
Kitabayashi et al.

(10) Patent No.: US 11,329,012 B2
(45) Date of Patent: May 10, 2022

(54) SEMICONDUCTOR DEVICE HAVING A CONDUCTIVE FILM ON AN INNER WALL OF A THROUGH HOLE

(71) Applicant: Mitsubishi Electric Corporation, Tokyo (JP)

(72) Inventors: Takuya Kitabayashi, Tokyo (JP); Hiroshi Yoshida, Tokyo (JP); Hidetoshi Ishibashi, Tokyo (JP); Daisuke Murata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 84 days.

(21) Appl. No.: 16/654,350

(22) Filed: Oct. 16, 2019

(65) Prior Publication Data

US 2020/0235060 A1 Jul. 23, 2020

(30) Foreign Application Priority Data

Jan. 17, 2019 (JP) .............................. JP2019-005675

(51) Int. Cl.
*H01L 23/62* (2006.01)
*H01L 23/498* (2006.01)
*H01L 23/492* (2006.01)

(52) U.S. Cl.
CPC ............ *H01L 23/62* (2013.01); *H01L 23/492* (2013.01); *H01L 23/49822* (2013.01); *H01L 23/49827* (2013.01); *H01L 23/49866* (2013.01)

(58) Field of Classification Search
None
See application file for complete search history.

(56) References Cited

U.S. PATENT DOCUMENTS

| 2006/0033199 A1* | 2/2006 | Kawakami | ............ H01L 23/467 257/700 |
| 2006/0244134 A1* | 11/2006 | Inagaki | ................... H01L 24/81 257/734 |
| 2017/0271280 A1 | 9/2017 | Nishizawa et al. | |

FOREIGN PATENT DOCUMENTS

JP 2017168590 A 9/2017

* cited by examiner

*Primary Examiner* — Niluta Rahim
(74) *Attorney, Agent, or Firm* — Studebaker & Brackett PC

(57) ABSTRACT

A technique for activating a fuse function in a semiconductor device in a relatively short time is provided. The semiconductor device includes a second bonding material provided on the upper surface of the insulating substrate, a third bonding material provided on an upper surface of the semiconductor element, a through hole extending from the first circuit pattern to the second circuit pattern via the core material, a conductive film provided on an inner wall of the through hole, and a heat insulating material provided inside the through hole and surrounded by the conductive film in plan view. The conductive film allows the first circuit pattern and the second circuit pattern to be conductive.

12 Claims, 3 Drawing Sheets

SEMICONDUCTOR DEVICE HAVING A CONDUCTIVE FILM ON AN INNER WALL OF A THROUGH HOLE

BACKGROUND OF THE INVENTION

Field of the Invention

The technique disclosed in the present specification relates to a semiconductor device.

Description of the Background Art

In the conventional semiconductor device disclosed in Japanese Patent Application Laid-Open No. 2017-168590, for example, a fuse member is provided between the inside of a through hole of the printed circuit board and a conductive post inserted into the through hole. Such a configuration ensures to improve the reliability of the semiconductor device.

SUMMARY

However, in the configuration disclosed in Japanese Patent Application Laid-Open No. 2017-168590, since a conductive post exists at the center of the through hole, if the fuse member is only partially melted, it does not function as a fuse. And since a certain time is required until the fuse member melts completely, it has been difficult to activate a fuse function in a short time.

The technique disclosed in the present specification intends to provide a technique for activating the fuse function in a semiconductor device in a relatively short time.

The first aspect of the technology disclosed in the present specification includes a first bonding material provided on an upper surface of an insulating substrate, a second bonding material provided on the upper surface of the insulating substrate, a semiconductor element provided on an upper surface of the first bonding material, a third bonding material provided on an upper surface of the semiconductor element, a first circuit pattern provided on the upper surface of the second bonding material and an upper surface of the third bonding material, a core material provided on an upper surface of the first circuit pattern, a second circuit pattern provided on an upper surface of the core material, a through hole extending from the first circuit pattern to the second circuit pattern via the core material, a conductive film provided on an inner wall of the through hole, and a heat insulating material provided inside the through hole and surrounded by the conductive film in plan view. The conductive film makes conductive connection between the first circuit pattern and the second circuit pattern.

The second aspect of the technology disclosed in the present specification includes a first bonding material provided on an upper surface of an insulating substrate, a second bonding material provided on the upper surface of the insulating substrate, a semiconductor element provided on an upper surface of the first bonding material, a third bonding material provided on an upper surface of the semiconductor element, a first circuit pattern provided on the upper surface of the second bonding material and an upper surface of the third bonding material, a core material provided on an upper surface of the first circuit pattern, a second circuit pattern provided on an upper surface of the core material, a through hole extending from the first circuit pattern to the second circuit pattern via the core material, an electronic element provided inside the through hole and having a fuse function. The electronic element makes conductive connection between the first circuit pattern and the second circuit pattern.

According to the first aspect of the technology disclosed in the present specification, when an overcurrent flows, the temperature of the conductive film that makes conductive connection between the first circuit pattern and the second circuit pattern increases locally which ensures melting in a short time. Therefore, the destruction of the semiconductor device due to the overcurrent flowing therein is effectively suppressed.

According to the second aspect of the technology disclosed in the present specification, when an overcurrent flows, the electronic element that makes conductive connection between the first circuit pattern and the second circuit pattern can activate the fuse function in a short time. Therefore, the destruction of the semiconductor device due to the overcurrent flowing therein is effectively suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
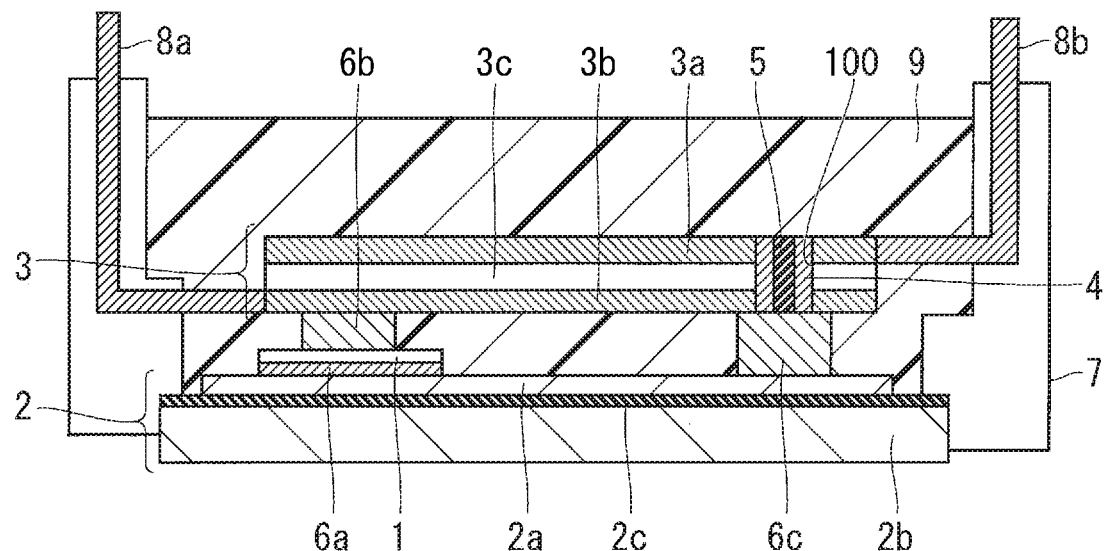
FIG. 1 is a cross-sectional view schematically illustrating an example of a configuration of semiconductor device according to Embodiment.

Hereinafter, Embodiments are described with reference to the accompanying drawings. In the following Embodiments, detailed features and the like are also illustrated for description of the technique; however, these are mere examples, and all of them are not necessarily essential features for implementation of Embodiments. And the example of the effect exhibited by each Embodiment is collectively described after the description of all Embodiments.

It should be noted that the drawings are schematically illustrated and, therefore, the configuration is, appropriately omitted or simplified for facilitating the description. Also, the mutual relationship among sizes and positions in configurations and the like illustrated in different drawings are not necessarily accurately described, and may be changed as appropriate. In addition, in the drawings such as plan views that are not cross-sectional views, hatching may be given to facilitate understanding of the contents of Embodiments.

In addition, in the following description, the same components are denoted by the same reference numerals, and the names and functions thereof are also similar. Accordingly, detailed descriptions thereof may be omitted to avoid redundancy.

Also although in the description described below, even when terms specifying specific positions and directions such as "up", "low", "left", "right", "side", "bottom", "front" or "rear" are used, these terms are used for convenience to facilitate understanding of the contents of Embodiment, and have no relation to the direction in actual implementation.

In addition, in the following description, in a case where "the upper surface of . . . " or "the lower surface of . . . " is described, in addition to the upper surface of the component of interest itself, a state in which other components are formed on the upper surface is also included. That is, for example, when it is described as "B provided on the upper surface of A", it does not preclude the interposition of another component "C" between A and B.

Further, in the following description, even when ordinal numbers such as "first" or "second" are stated, the terms are used to facilitate understanding of Embodiments, and therefore, the usage of the ordinal numbers does not limit the indication of the ordinal numbers to ordering.

Embodiment 1

Hereinafter, a semiconductor device according to Embodiment 1 will be described.

<Configuration of Semiconductor Device>

FIG. 1 is a cross-sectional view schematically illustrating an example of a configuration of semiconductor device according to Embodiment 1. As illustrated in FIG. 1, the semiconductor device includes a metal plate 2b, an insulating sheet 2c disposed on the upper surface of the metal plate 2b, a metal circuit pattern 2a disposed on the upper surface of the insulating sheet 2c, and a semiconductor element 1 disposed on the upper surface of the pattern 2a via a bonding material 6a such as solder. Here, an insulating substrate 2 includes the metal circuit pattern 2a, an insulating sheet 2c, and the metal plate 2b.

In addition, the semiconductor device includes a lower surface thick copper circuit pattern 3b disposed via the bonding material 6b such as solder on the upper surface of the semiconductor element 1 and via a bonding material 6c such as solder on the upper surface of the metal circuit pattern 2a, a core material 3c disposed on the upper surface of the lower surface thick copper circuit pattern 3b, and an upper surface thick copper circuit pattern 3a disposed on the upper surface of the core material 3c. Here, a printed circuit board 3 includes the upper surface thick copper circuit pattern 3a, the core material 3c, and the lower surface thick copper circuit pattern 3b.

The core material 3c is made of a material equivalent to a flame retardant type 4 (FR4). Further, the upper surface thick copper circuit pattern 3a and the lower surface thick copper circuit pattern 3b are circuit patterns for large current, for example, and are formed of copper having a thickness of 0.3 mm or more and 0.5 mm or less, for example.

In the semiconductor device, a through hole 100 penetrating the upper surface thick copper circuit pattern 3a, the core material 3c, and the lower surface thick copper circuit pattern 3b of the printed circuit board 3 is formed. The shape of the through hole 100 in plan view may be a circular shape or a polygonal shape. And the through hole 100 is formed at a position overlapping the bonding material 6c in plan view.

And a copper plating 4 made of copper is formed on the inner wall of the through hole 100. The copper plating 4 makes conductive connection between the upper surface thick copper circuit pattern 3a and the lower surface thick copper circuit pattern 3b. It should be noted that, the copper plating has a thickness of 0.3 mm or more and 0.5 mm or less, for example. Further, the copper formed on the inner wall of the through hole 100 is not limited to plating formed by a plating process, and may be a copper film formed by another film forming method.

Further, the inside of the through hole 100, that is, the inside surrounded by the copper plating 4 in plan view in the through hole 100 is filled with a resin material 5 having an insulating property and a thermal conductivity lower than that of copper. Note, in FIG. 1, although the resin material 5 is filled in the inside of the through hole 100 entirely, the resin material 5 may be filled in at least part of the inside of the through hole 100.

Here, the resin material 5 includes, for example, silicone gel, epoxy resin, phenol resin, or polyvinyl chloride (i.e. PVC).

Further, the inside of the through hole 100 filled with the resin material 5 may be a cavity. In that case, it functions as a structure where air has insulating property and heat insulating property.

Also, the semiconductor device includes a case 7 surrounding the insulating substrate 2 in plan view, a metal terminal 8a that extends from the case 7 and that electrically connects the lower thick copper circuit pattern 3b and the outside, a metal terminal 8b that extends from the case 7 and electrically connects the upper surface thick copper circuit pattern 3a and the outside, and a sealing material 9 that fills the inside of the case 7.

Here, the sealing material 9 may be the same material as the resin material 5. In that case, the process of filling the resin material 5 into the through hole 100 and the process of filling the sealing material 9 into the case 7 may be the same process, so the number of manufacturing processes can be reduced.

In the above configuration, the insulating substrate 2 and the printed circuit board 3 are electrically and mechanically bonded to the semiconductor element 1 via the bonding material 6a or the bonding material 6b.

Also in the above configuration, the lower surface of the metal plate 2b is exposed from the case 7. The end portion of the metal terminal 8a and the end portion of the metal terminal 8b are also exposed from the case 7.

Note, the bonding material 6c may be formed not on the upper surface of the metal circuit pattern 2a but on the upper surface of the semiconductor element 1.

Embodiment 2

Hereinafter, a semiconductor device according to Embodiment 2 will be described. In the following description, the same components in above-described Embodiment are illustrated in the drawings with the same reference numerals, and detailed description thereof is appropriately omitted.

<Configuration of Semiconductor Device>

Figure 2:
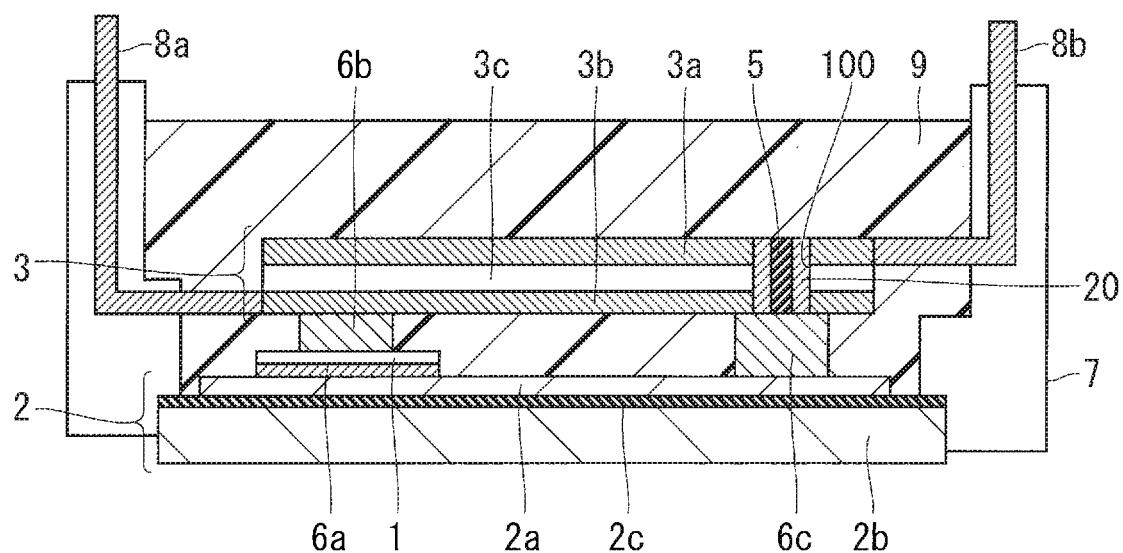
FIG. 2 is a cross-sectional view schematically illustrating an example of a configuration of semiconductor device according to Embodiment.

FIG. 2 is a cross-sectional view schematically illustrating an example of a configuration of semiconductor device according to Embodiment 2. As illustrated in FIG. 2, the semiconductor device includes a metal plate 2b, an insulating sheet 2c, a metal circuit pattern 2a, a semiconductor element 1, a lower surface thick copper circuit pattern 3b, a core material 3c, and an upper surface thick copper circuit pattern 3a.

Also, a through hole 100 is formed in the semiconductor device. And the inner wall of the through hole 100 is plated with a conductive material 20 having a melting point lower than that of copper. The conductive material 20 makes conductive connection between the upper surface thick copper circuit pattern 3a and the lower surface thick copper circuit pattern 3b. The conductive material 20 includes, for example, solder, aluminum, silver, or the like.

Further, the conductive material 20 formed on the inner wall of the through hole 100 is not limited to plating formed by a plating process, and may be a film formed by another film forming method.

Further, the inside of the through hole 100, that is, the inside surrounded by the conductive material 20 in the through hole 100 is filled with a resin material 5 having an insulating property and a low thermal conductivity.

The semiconductor device also includes a case 7, a metal terminal 8a, a metal terminal 8b, and a sealing material 9.

Embodiment 3

Hereinafter, a semiconductor device according to Embodiment 3 will be described. In the following description, the same components in above-described Embodiments are illustrated in the drawings with the same reference numerals, and detailed description thereof is appropriately omitted.

<Configuration of Semiconductor Device>

Figure 3:
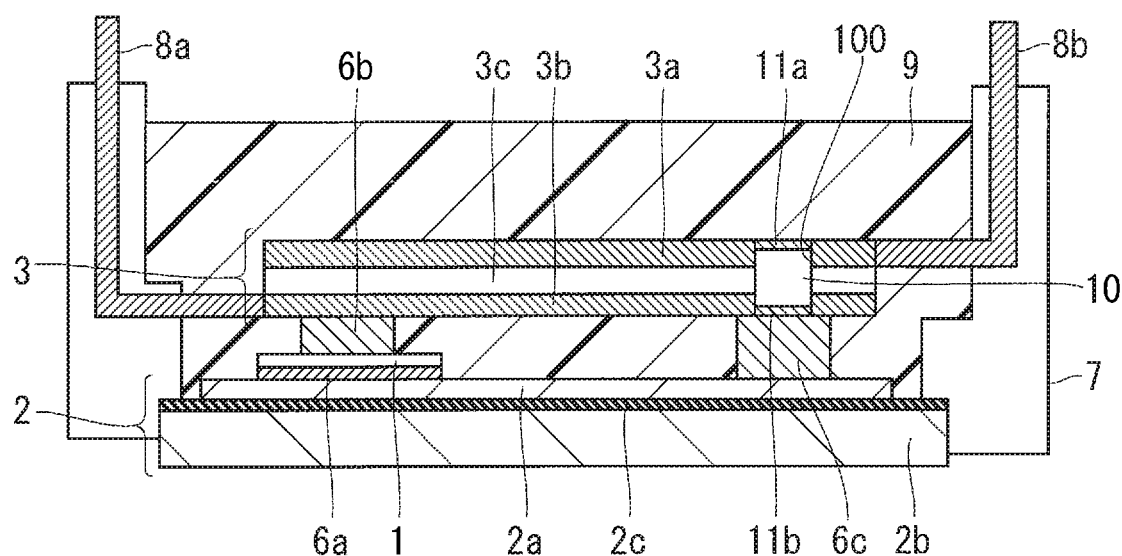
FIG. 3 is a cross-sectional view schematically illustrating an example of a configuration of semiconductor device according to Embodiment.

FIG. 3 is a cross-sectional view schematically illustrating an example of a configuration of semiconductor device according to Embodiment 3. As illustrated in FIG. 3, the semiconductor device includes a metal plate 2b, an insulating sheet 2c, a metal circuit pattern 2a, a semiconductor element 1, a lower surface thick copper circuit pattern 3b, a core material 3c, and an upper surface thick copper circuit pattern 3a.

Also, a through hole 100 is formed in the semiconductor device. An electronic element 10 having a fuse function is disposed inside the through hole 100.

The electronic element 10 is electrically and mechanically connected to the upper surface thick copper circuit pattern 3a via a bonding material 11a. The electronic element 10 is also electrically and mechanically connected to the lower surface thick copper circuit pattern 3b via a bonding material 11b.

The electronic element 10 includes, for example, a chip fuse that is a general-purpose product. The electronic element 10 is provided with a fuse member, such as a meltable thin film and makes conductive connection between the upper surface thick copper circuit pattern 3a and the lower surface thick copper circuit pattern 3b via the bonding material 11a, the bonding material 11b, and the fuse member.

And when an overcurrent flows through the electronic element 10, the fuse member in the electronic element 10 melts in a relatively short time. The time until the fuse member melts is adjustable by changing the thickness and material of the fuse member.

Here, the bonding material 11a and the bonding material 11b may be the same material as the bonding material 6a, the bonding material 6b, and the bonding material 6c.

Embodiment 4

Hereinafter, a semiconductor device according to Embodiment 4 will be described. In the following description, the same components in above-described Embodiments are illustrated in the drawings with the same reference numerals, and detailed description thereof is appropriately omitted.

<Configuration of Semiconductor Device>

Figure 4:
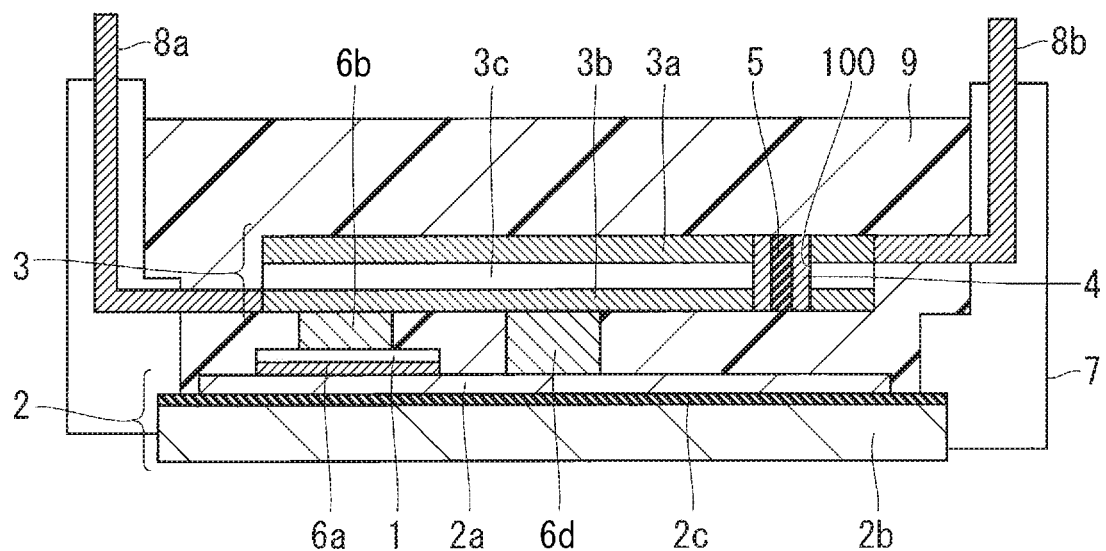
FIG. 4 is a cross-sectional view schematically illustrating an example of a configuration of semiconductor device according to Embodiment.

FIG. 4 is a cross-sectional view schematically illustrating an example of a configuration of semiconductor device according to Embodiment 4. As illustrated in FIG. 4, the semiconductor device includes a metal plate 2b, an insulating sheet 2c, a metal circuit pattern 2a, a semiconductor element 1.

In addition, the semiconductor device includes a lower surface thick copper circuit pattern 3b, a core material 3c, and an upper surface thick copper circuit pattern 3a disposed via the bonding material 6b on the upper surface of the semiconductor element 1 and via a bonding material 6d such as solder on the upper surface of the metal circuit pattern 2a.

Also, a through hole 100 is formed in the semiconductor device. Also, the through hole 100 is formed at a position not overlapping the bonding material 6c in plan view. It should be noted that, in FIG. 4, although the through hole 100 is formed at a position not overlapping the bonding material 6d and the semiconductor element 1 in plan view, the through hole 100 may be disposed at a position not overlapping the bonding material 6d but overlapping the semiconductor element 1.

And a copper plating 4 is formed on the inner wall of the through hole 100. The copper plating 4 makes conductive connection between the upper surface thick copper circuit pattern 3a and the lower surface thick copper circuit pattern 3b.

Further, the inside of the through hole 100, that is, the inside surrounded by the copper plating 4 in the through hole 100 is filled with a resin material 5 having an insulating property and a low thermal conductivity.

The semiconductor device also includes a case 7, a metal terminal 8a, a metal terminal 8b, and a sealing material 9.

Embodiment 5

Hereinafter, a semiconductor device according to Embodiment 5 will be described. In the following description, the same components in above-described Embodiments are illustrated in the drawings with the same reference numerals, and detailed description thereof is appropriately omitted.

<Configuration of Semiconductor Device>

Figure 5:
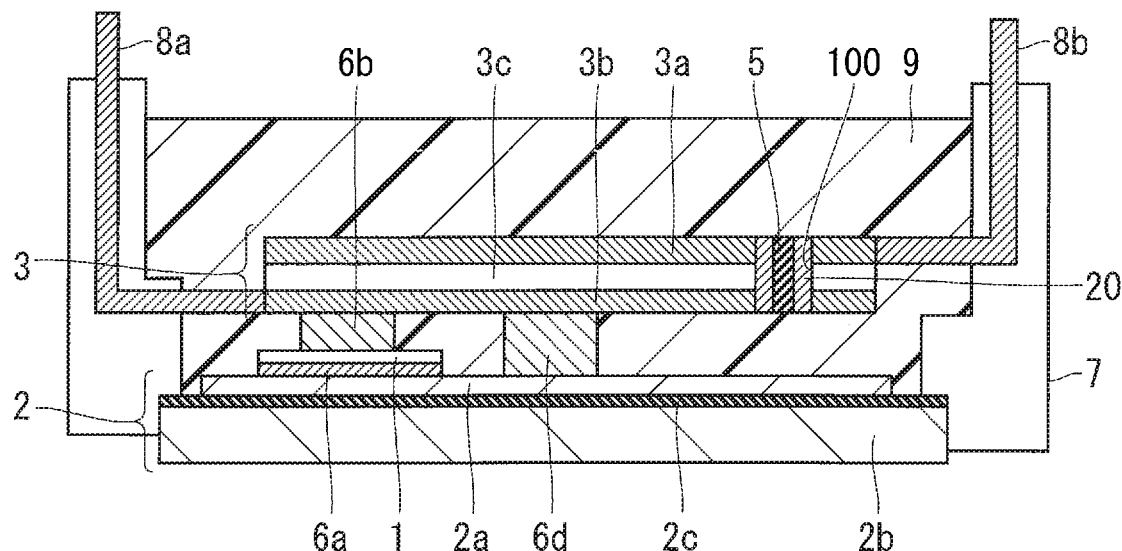
FIG. 5 is a cross-sectional view schematically illustrating an example of a configuration of semiconductor device according to Embodiment.

FIG. 5 is a cross-sectional view schematically illustrating an example of a configuration of semiconductor device according to Embodiment 5. As illustrated in FIG. 5, the semiconductor device includes a metal plate 2b, an insulating sheet 2c, a metal circuit pattern 2a, a semiconductor element 1.

In addition, the semiconductor device includes a lower surface thick copper circuit pattern 3h, a core material 3c, and an upper surface thick copper circuit pattern 3a disposed via the bonding material 6b on the upper surface of the semiconductor element 1 and via a bonding material 6d on the upper surface of the metal circuit pattern 2a.

Also, a through hole 100 is formed in the semiconductor device. Also, the through hole 100 is formed at a position not overlapping the bonding material 6d in plan view. And a conductive material 20 having a lower melting point is formed in the inner wall of the through hole 100. The conductive material 20 makes conductive connection between the upper surface thick copper circuit pattern 3a and the lower surface thick copper circuit pattern 3b.

Further, the inside of the through hole 100, that is, the inside surrounded by the conductive material 20 in the through hole 100 is filled with a resin material 5 having an insulating property and a low thermal conductivity.

The semiconductor device also includes a case 7, a metal terminal 8a, a metal terminal 8b, and a sealing material 9.

Embodiment 6

Hereinafter, a semiconductor device according to Embodiment 6 will be described. In the following description, the same components in above-described Embodiments are illustrated in the drawings with the same reference numerals, and detailed description thereof is appropriately omitted.

<Configuration of Semiconductor Device>

Figure 6:
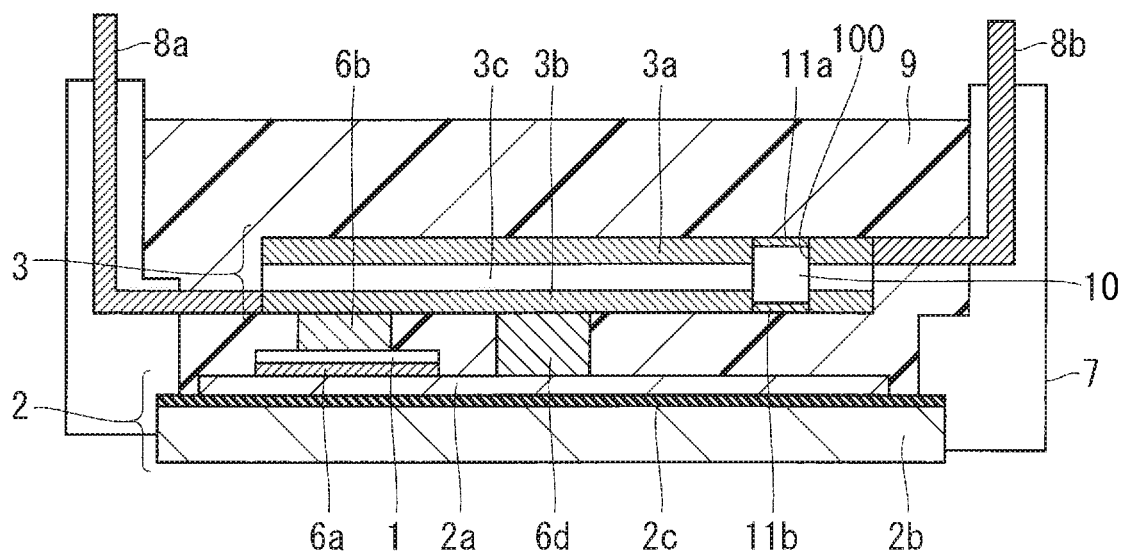
FIG. 6 is a cross-sectional view schematically illustrating an example of a configuration of semiconductor device according to Embodiment.

FIG. 6 is a cross-sectional view schematically illustrating an example of a configuration of semiconductor device according to Embodiment 6. As illustrated in FIG. 6, the semiconductor device includes a metal plate 2b, an insulating sheet 2c, a metal circuit pattern 2a, a semiconductor element 1.

In addition, the semiconductor device includes a lower surface thick copper circuit pattern 3b, a core material 3c, and an upper surface thick copper circuit pattern 3a disposed via the bonding material 6b on the upper surface of the semiconductor element 1 and via a bonding material 6d on the upper surface of the metal circuit pattern 2a.

Also, a through hole 100 is formed in the semiconductor device. Also, the through hole 100 is formed at a position not overlapping the bonding material 6d in plan view. An electronic element 10 having a fuse function is disposed inside the through hole 100.

The electronic element 10 is electrically and mechanically connected to the upper surface thick copper circuit pattern 3a via a bonding material 11a. The electronic element 10 is also electrically and mechanically connected to the lower surface thick copper circuit pattern 3b via a bonding material 11b.

Effects of Above-Described Embodiments

Next, examples of effects of above-described Embodiments will be described.

It should be noted that, in the following description, effects will be described based on the specific configurations illustrated as the examples in Embodiments described above. However, within the scope of the similar effects, such configurations may be replaced with other specific configurations illustrated as examples in the present specification.

Also, the replacement may be implemented across a plurality of Embodiments. That is, each of the configurations illustrated with the examples in the corresponding Embodiments may be combined one another to produce the similar effects.

According to Embodiments described above, the semiconductor device includes a first bonding material, a second bonding material, a semiconductor element 1, a third bonding material, a first circuit pattern, a core material 3c, a second circuit pattern, a through hole 100, a conductive film, and a heat insulating material. Here, the first bonding material corresponds to the bonding material 6a, for example. Here, the second bonding material corresponds to any one of the bonding material 6c and the bonding material 6d, for example. Here, the third bonding material corresponds to the bonding material 6b, for example. Here, the first circuit pattern corresponds to the lower surface thick copper circuit pattern 3b, for example. Here, the second circuit pattern corresponds to the upper surface thick copper circuit pattern 3a, for example. Here, the conductive film corresponds to the copper plating 4 and the conductive material 20, for example. Here, the heat insulating material corresponds to the resin material 5, for example. The bonding material 6a is formed on the upper surface of the insulating substrate 2. The bonding material 6c is formed on the upper surface of the insulating substrate 2. The semiconductor element 1 is disposed on the upper surface of the bonding material 6a. The bonding material 6b is formed on the upper surface of the semiconductor element 1. The lower surface thick copper circuit pattern 3b is disposed over the upper surface of the bonding material 6c and the upper surface of the bonding material 6b. The core material 3c is disposed on the upper surface of the lower surface thick copper circuit pattern 3b. The upper surface thick copper circuit pattern 3a is disposed on the upper surface of the core material 3c. The through hole 100 is formed such that the through hole 100 extends from the lower surface thick copper circuit pattern 3b to the upper surface thick copper circuit pattern 3a via the core material 3c. The copper plating 4 is formed on the inner wall of the through hole 100. The resin material 5 is formed inside the through hole 100 and surrounded by the copper plating 4 in plan view. Here, the copper plating 4 makes conductive connection between the lower surface thick copper circuit pattern 3b and the upper surface thick copper circuit pattern 3a.

According to such a configuration, when an overcurrent flows, the temperature of the copper plating 4 that makes conductive connection between the lower surface thick copper circuit pattern 3b and the upper surface thick copper circuit pattern 3a increases locally which ensures melting in a short time. Therefore, the destruction of the semiconductor device due to the overcurrent flowing therein is effectively suppressed. Further, since the copper plating 4 is sufficiently thin, the fuse function can be activated in a shorter time than when a conductive pole is disposed in the through hole, for example. Further, since the copper plating 4 is sufficiently thin, the fuse function can be activated even with relatively small amperage. Further, since the copper plating 4 is formed on the inner wall of the through hole 100, providing a fuse function in the semiconductor device is ensured without reducing the effective area of the tipper surface thick copper circuit pattern 3a and the effective area of the lower surface thick copper circuit pattern 3b. In addition, since the inside of the through hole 100 is filled with the resin material 5 that is a heat insulating material, concentration of heat on the copper plating 4 is promoted so that the fuse function can be activated in a short time.

It should be noted that, even in the case where at least one of the other configurations other than the configurations illustrated in the specification is appropriately added to the configuration described above, that is, other configurations other than the configurations illustrated in the specification, which are not referred to as configurations described above are appropriately added, the similar effects can be produced.

Further, according to Embodiments described above, the lower surface thick copper circuit pattern 3b and the upper surface thick copper circuit pattern 3a are made of copper having a thickness of 0.3 mm or more and 0.5 mm or less. According to such a configuration, application to uses for a power semiconductor device or the like which flows a large current is ensured.

Further, according to Embodiments described above, the melting point of the conductive material 20 is lower than the melting point of copper. According to such a configuration, since the time until the conductive material 20 is melted is shortened, the time until the fuse function is activated can be shortened.

Further, according to Embodiments described above, the conductive material 20 includes aluminum or silver. According to such a configuration, since the time until the conductive material 20 is melted is shortened, the time until the fuse function is activated can be shortened.

Further, according to Embodiment described above, the copper plating 4 has a thickness of 0.05 mm or more and 0.3 mm or less. According to such a configuration, since the copper plating 4 is sufficiently thin, the time required for melting when an overcurrent flows is short. Therefore, the time until the fuse function is activated can be shortened.

Further, according to Embodiment described above, the copper plating 4 is plating formed by a plating process. According to such a configuration, thin film can be easily formed by the plating process; therefore, the time until the fuse function is activated can be shortened.

Further, according to Embodiments described above, the thermal conductivity of the resin material 5 is lower than the thermal conductivity of copper. According to such a configuration, in the inside of the through hole 100, heat is concentrated locally on the copper plating 4; therefore, the copper plating 4 can be melted in a short time. Therefore, the time until the fuse function is activated can be shortened.

Further, according to Embodiments described above, the resin material 5 includes silicone gel, epoxy resin, phenol resin, or polyvinyl chloride. According to such a configuration, in the inside of the through hole 100, heat is concentrated locally on the copper plating 4; therefore, the copper plating 4 can be melted in a short time. Therefore, the time until the fuse function is activated can be shortened.

Also, according to Embodiments described above, the through hole 100 is formed at a position overlapping the bonding material 6c in plan view. According to such a configuration, when an overcurrent flows, the temperature of the copper plating 4 that makes conductive connection between the lower surface thick copper circuit pattern 3b and the upper surface thick copper circuit pattern 3a increases locally which ensures melting in a short time. Therefore, the destruction of the semiconductor device due to the overcurrent flowing therein is effectively suppressed.

Also, according to Embodiments described above, the through hole 100 is at a position not overlapping the bonding material 6d in plan view. According to such a configuration, the total amount of current that flows into the metal circuit pattern 2a can be reduced by the time the fuse function is activated, as the current path from the through hole 100 to the metal circuit pattern 2a via the lower thick copper circuit pattern 3b and the bonding material 6d is extended. Therefore, destruction of the semiconductor device can be effectively suppressed.

Further, According to Embodiments described above, the semiconductor device includes a bonding material 6a, a bonding material 6c, a semiconductor element 1, a bonding material 6b, a lower surface thick copper circuit pattern 3b, a core material 3c, an upper surface thick copper circuit pattern 3a, a through hole 100, and an electronic element 10. The bonding material 6a is formed on the upper surface of the insulating substrate 2. The bonding material 6c is formed on the upper surface of the insulating substrate 2. The semiconductor element 1 is disposed on the upper surface of the bonding material 6a. The bonding material 6b is formed on the upper surface of the semiconductor element 1. The lower surface thick copper circuit pattern 3b is disposed over the upper surface of the bonding material 6c and the upper surface of the bonding material 6b. The core material 3c is disposed on the upper surface of the lower surface thick copper circuit pattern 3b. The upper surface thick copper circuit pattern 3a is disposed on the upper surface of the core material 3c. The through hole 100 is formed such that the through hole 100 extends from the lower surface thick copper circuit pattern 3b to the upper surface thick copper circuit pattern 3a via the core material 3c. An electronic element 10 is disposed inside the through hole 100. Further, the electronic element 10 has a fuse function. Here, the electronic element 10 makes conductive connection between the lower surface thick copper circuit pattern 3b and the upper surface thick copper circuit pattern 3a.

According to such a configuration, when an overcurrent flows, the electronic element 10 that makes conductive connection between the lower surface thick copper circuit pattern 3b and the upper surface thick copper circuit pattern 3a can activate the fuse function in a short time. Therefore, the destruction of the semiconductor device due to the overcurrent flowing therein is effectively suppressed. Further, since the electronic element 10 is disposed on the inner wall of the through hole 100, providing a fuse function in the semiconductor device is ensured without reducing the effective area of the upper surface thick copper circuit pattern 3a and the effective area of the lower surface thick copper circuit pattern 3b. If the electronic element 10 is provided, a conductive film is not required to be formed on the inner wall of the through hole 100.

It should be noted that, even in the case where at least one of the other configurations other than the configurations illustrated in the specification is appropriately added to the configuration described above, that is, other configurations other than the configurations illustrated in the specification, which are not referred to as configurations described above are appropriately added, the similar effects can be produced.

Modification of Embodiments Described Above

In Embodiment described above, the material, ingredient, dimension, shape, relative arrangement relationship, or implementation condition of each component may be described, but the above description is illustrative in all aspects, and is not limited to those described in the present specification.

Accordingly, it is understood that numerous other modifications variations, and equivalents can be devised without departing from the scope of the invention. For example, a case where at least one component is modified, a case where at least one component is added or omitted, and further a case where at least one component in at least one Embodiments is extracted and combining the component with components in other Embodiments is included.

Further, "one or more" may be included as a component described as "one" in Embodiments described above, so far as consistent with Embodiments.

Furthermore, each component in Embodiments described above is a conceptual unit, and within the scope of the technology disclosed in the present specification, a case where one component is composed of a plurality of structures, a case where one component corresponds to a part of a structure, and a case where a plurality of components are provided in one structure are included.

Further, each component in Embodiments described above include a structure having another structure or shape as long as the same function is exhibited.

Also, the descriptions in the present specification are referred for the every object related to the technique, and none of them are regarded as conventional techniques.

Further, in Embodiments described above, when a material name or the like is described without being particularly specified, the material contains other additives, for example, an alloy or the like so far as consistent with Embodiments.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a first bonding material provided on an upper surface of an insulating substrate;
   a second bonding material provided on the upper surface of the insulating substrate;
   a semiconductor element provided on an upper surface of the first bonding material;
   a third bonding material provided on an upper surface of the semiconductor element;
   a first circuit pattern provided on an upper surface of the second bonding material and an upper surface of the third bonding material;
   a core material provided on an upper surface of the first circuit pattern;
   a second circuit pattern provided on an upper surface of the core material;
   a through hole extending from the first circuit pattern to the second circuit pattern via the core material;
   a conductive film provided on an inner wall of the through hole; and
   a heat insulating material provided inside the through hole and a periphery of the heat insulating material is surrounded by the conductive film, wherein
   the conductive film makes conductive connection between the first circuit pattern and the second circuit pattern.

2. The semiconductor device according to claim 1, wherein
   the first circuit pattern and the second circuit pattern are made of copper having a thickness of 0.3 mm or more and 0.5 mm or less.

3. The semiconductor device according to claim 1, wherein
   a melting point of the conductive film is lower than a melting point of copper.

4. The semiconductor device according to claim 1, wherein
   The conductive film includes aluminum or silver.

5. The semiconductor device according to claim 1, wherein
   the conductive film has a thickness of 0.05 mm or more and 0.3 mm or less.

6. The semiconductor device according to claim 1, wherein
   the conductive film is plating formed by a plating process.

7. The semiconductor device according to claim 1, wherein
   a thermal conductivity of the heat insulating material is lower than a thermal conductivity of copper.

8. The semiconductor device according to claim 1, wherein
   the heat insulating material includes silicone gel, epoxy resin, phenol resin or polyvinyl chloride.

9. The semiconductor device according to claim 1, wherein
   the through hole is arranged directly over the second bonding material when viewed from a cross-sectional view of the semiconductor device.

10. The semiconductor device according to claim 1, wherein the first bonding material and the second bonding material are in direct contact with the insulating substrate.

11. The semiconductor device according to claim 1, wherein the first bonding material and the second bonding material are not in direct contact with each other.

12. The semiconductor device according to claim 1, wherein the third bonding material is comprised of solder.

* * * * *